United States Patent [19]
Fayette

[11] Patent Number: 4,519,025
[45] Date of Patent: May 21, 1985

[54] SENSE POINT MONITOR CIRCUIT
[75] Inventor: Brad K. Fayette, St. Petersburg, Fla.
[73] Assignee: GTE Communication Systems Corporation, Northlake, Ill.
[21] Appl. No.: 439,955
[22] Filed: Nov. 8, 1982
[51] Int. Cl.[3] .......................................... H03K 13/32
[52] U.S. Cl. .................................. 364/141; 364/178; 364/184; 371/67
[58] Field of Search ............... 364/141, 178, 179, 184; 371/67

[56] References Cited
U.S. PATENT DOCUMENTS
3,604,906 9/1971 Hunter et al. .......................... 371/67
4,352,094 9/1982 Reneric ............................ 364/575 X Primary Examiner—Jerry Smith
Assistant Examiner—Allen MacDonald
Attorney, Agent, or Firm—Robert J. Black; Gregory G. Hendricks

[57] ABSTRACT

A monitor circuit which discriminates between valid and invalid (bouncing) changes in state of monitored sense points. A microprocessor periodically scans a plurality of sense points, logically determines the validity of each sense point during each scan and stores data representing the validity of these sense points in a memory.

5 Claims, 1 Drawing Figure

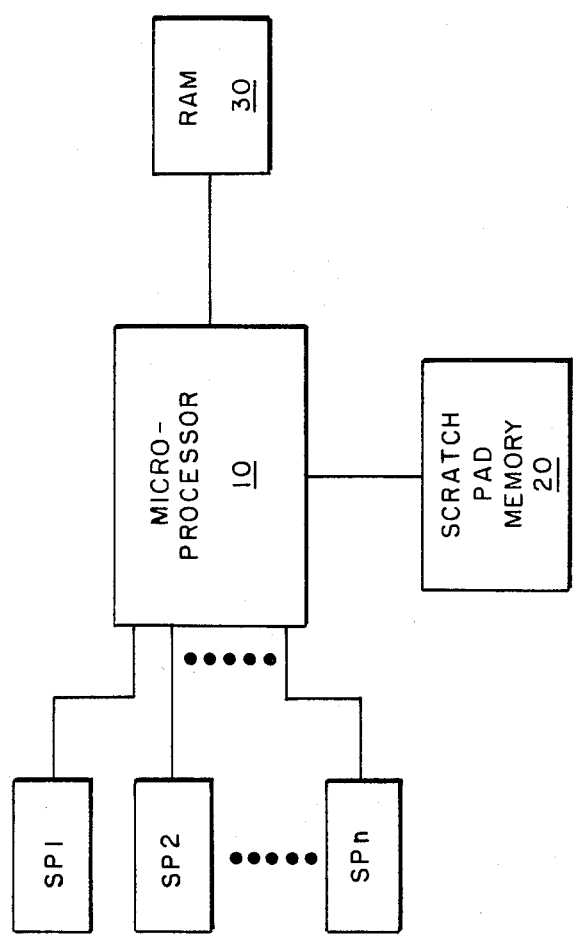

SENSE POINT MONITOR CIRCUIT

FIELD OF THE INVENTION

The present invention relates to monitor circuits and more particularly to a sense point monitor circuit.

BACKGROUND OF THE INVENTION

Sense point monitor circuits are commonly connected to switch or relay contacts. These circuits typically include a delay or feedback circuit connected to the associated switch or relay contact. The output signals provided by these circuits then represent the valid (debounced) state of the associated switch or relay contact. However, such an arrangement, with delay or feedback circuitry connected to each sense point, becomes expensive as the number of monitored sense points increases.

Accordingly, it is the object of the present invention to provide a novel sense point monitor circuit without the requirement of delay or feedback circuitry.

SUMMARY OF THE INVENTION

In accordance with the present invention, a sense point monitor circuit is provided. This circuit is connected to a plurality of sense points each operative to provide a status signal of a first or second characteristic, and it includes processing means having a plurality of first, second and third storage locations. This processing means is operative to periodically scan each sense point and store the status signal of each scanned sense point in an associated first storage location. It is further operative to transfer the contents of the first storage location to an associated second storage location prior to each subsequent scan of the sense point.

The processing means is further operative in response to a signal of the first characteristic from the associated first and second storage locations to store a resultant signal of a first characteristic in an associated third storage location.

It is further operative in response to a signal of the first characteristic from the associated first and third or second and third storage locations to store the resultant signal of a first characteristic in the associated third storage location.

The processing means is further operative in response to a signal of the second characteristic from the associated first and second or first and third or second and third storage locations to store a resultant signal of a second characteristic in said associated third storage location.

DESCRIPTION OF THE DRAWING

The single FIGURE of the accompanying drawing is a block diagram of a sense point monitor circuit in accordance with the present invention.

DESCRIPTION OF THE PREFERRED EMBODIMENT

Referring now to the accompanying drawing the sense point monitor circuit of the present invention is shown. MICROPROCESSOR 10 is connected to sense points SP1-SPn, SCRATCH PAD MEMORY 20 and random-access-memory (RAM) 30. PROCESSOR 10, SCRATCH PAD MEMORY 20 and RAM 30 operate as a processing circuit. Sense points SP1-SPn typically include switch or relay contacts.

MICROPROCESSOR 10 periodically scans sense points SP1-SPn. The status of the sense points are then stored in words of SCRATCH PAD MEMORY 20 designated as current status (CS) words. Before the next scan, the data in the current status words are transferred to words of RAM 30 designated as last status (LS) words. On the next scan of the sense points PROCESSOR 10 again stores the current status of the sense points in the CS words. This current status data is then logically compared to the data in the last status words and the resultant data is stored in words of RAM 30 designated as debounced status (DS) words. Then, MICROPROCESSOR 10 again moves the data in the CS words to the LS words in preparation for the next scanning and comparison cycle.

On each subsequent scan of the sense points, MICROPROCESSOR 10 first scans the sense points, then stores data representative of their status in the CS words, logically compares that data to the data in the LS and DS words, and compares the data in the LS words to the data in the DS words. The data resulting from these comparisons represents the new debounced status of the sense points and that data is stored in the DS words. MICROPROCESSOR 10 then moves the data in the CS words to the LS words.

Thus, on each scan, MICROPROCESSOR 10 updates the debounced status of the sense points. MICROPROCESSOR 10 debounces the sense points by changing the associated data in the DS words only when a change in status of a sense point remains constant for at least as long as the time period required for two successive scans of the sense point. If the status of a sense point is not constant for at least two successive scans, it is considered to be noise and is ignored.

For example, MICROPROCESSOR 10 writes a logic level 1 (resultant signal of a first characteristic) into a bit of the debounced status word (third storage location) associated with a particular sense point when the associated bit of the current status and last status words (first and second storage locations) for that sense point are both at a logic level 1 (status signal of a first characteristic). This process is logically represented as $NDS = LS \cdot CS$ (equation 1) where NDS=new debounced status. The new debounced status and current status data are then written into the DS and LS bits, respectively. Under these conditions, the state of the DS bit is irrelevant since the data in the DS bit was either already at a logic level 1 or it is being changed from a logic level $\emptyset$ (resultant signal of a second characteristic) to a logic level 1 in response to a valid change in status of the associated sense point.

MICROPROCESSOR 10 also writes a logic level 1 into a sense point's debounced status bit when the last status and debounced status bits for that sense point are both at a logic level 1. This process is logically represented as $NDS = LS \cdot DS$ (equation 2). Again, the new debounced and current status data are then written into the DS and LS bits respectively. Under these conditions, the state of the CS bit is irrelevant since the sense point is either bouncing, and the CS bit will be at a logic level $\emptyset$ (status signal of a second characteristic) for only one scan, or the CS bit remained at a logic level 1, causing equation 1 to also write a logic level 1 into the DS bit. Another alternative is that a valid change will be detected on the next scan.

MICROPROCESSOR 10 also writes a logic level 1 into the debounced status bit of a sense point when the current status and debounced status bits for that sense point are both at a logic level 1. This process is logically represented as $NDS = CS \cdot \overline{DS}$ (equation 3). Again, the new debounced and current status data are written into the DS and LS bits, respectively. Under these conditions the state of the LS bit is irrelevant since the data in the LS bit either represents noise (one scan at a logic level $\emptyset$) or the CS bit remained at a logic level 1, causing equations 1 and 2 to also write a logic level 1 into the DS bit.

Obviously, if neither equations 1, 2 nor 3 cause a logic level 1 to be written into the DS bit, then a logic level $\emptyset$ will be written there. These three equations can be combined into an equation 4 as follows:

$$NDS = (LS \cdot CS) + (LS \cdot DS) + (CS \cdot DS)$$

The various logical conditions resulting from this equation are summarized in the following table, which shows all possible data combinations on each successive scan.

| Debounced Status | Last Status | Current Status | New Debounced Status |
|---|---|---|---|
| DS | LS | CS | NDS |
| 0 | 0 | 0 | 0 |
| 0 | 0 | 1 | 0 |
| 0 | 1 | 0 | 0 |
| 0 | 0 | 1 | 0 |
| 0 | 1 | 1 | 1 |
| 1 | 1 | 1 | 1 |
| 1 | 1 | 0 | 1 |
| 1 | 0 | 1 | 1 |
| 1 | 1 | 0 | 1 |
| 1 | 0 | 0 | 0 |

As previously described and as indicated in this table, the NDS and CS data of any particular scan are written into the DS and LS bits before the next scan.

Thus, the sense point monitor circuit of the present invention periodically scans connected sense points and updates the debounced status bit for each sense point on each scan.

It will be obvious to those skilled in the art that numerous modifications of the present invention can be made without departing from the spirit of the invention which shall be limited only by the scope of the claims appended hereto.

What is claimed is:

1. A sense point monitor circuit connected to a plurality of sense points each operated to provide a status signal of a first or second characteristic, said sense point monitor circuit comprising:
   storage means having a plurality of first, second and third storage locations;
   scanning means connected to said sense points and said storage means and operated to periodically scan each sense point and store the status signal of each scanned sense point in an associated first storage location;
   processing means connected to said storage means and operated to transfer the contents of said first storage location to an associated second storage location prior to each subsequent scan of said associated sense point;
   said processing means being further operated in response to a signal of said first characteristic from said associated first and second storage locations to store a resultant signal of a first characteristic in an associated third storage location;
   said processing means being further operated in response to a signal of said first characteristic from said associated first and third or second and third storage locations to store said resultant signal of a first characteristic in said associated third storage location; and
   said processing means being further operated in response to a signal of said second characteristic from said associated first and second or first and third or second and third storage locations to store a resultant signal of a second characteristic in said associated third storage location.

2. A sense point monitor circuit as claimed in claim 1, wherein said processing means comprises a microprocessor.

3. A sense point monitor circuit as claimed in claim 2, wherein said storage means comprises a random access memory connected to said microprocessor and effective to provide said pluralities of second and third storage locations.

4. A sense point monitor circuit as claimed in claim 2, wherein said storage means comprises:
   a scratch pad memory connected to said microprocessor and effective to provide said plurality of first storage locations; and
   a random access memory connected to said microprocessor and effective to provide said pluralities of second and third storage locations.

5. A sense point monitor circuit as claimed in claim 2, wherein said storage means comprises: a scratch pad memory connected to said microprocessor and effective to provide said plurality of first storage locations.

* * * * *